United States Patent
Ozeki et al.

(10) Patent No.: US 8,710,568 B2
(45) Date of Patent: Apr. 29, 2014

(54) SEMICONDUCTOR DEVICE HAVING A PLURALITY OF ELEMENTS ON ONE SEMICONDUCTOR SUBSTRATE AND METHOD OF MANUFACTURING THE SAME

(75) Inventors: Yoshihiko Ozeki, Okazaki (JP); Tetsuo Fujii, Toyohashi (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 329 days.

(21) Appl. No.: 12/289,222

(22) Filed: Oct. 23, 2008

(65) Prior Publication Data
US 2009/0108288 A1    Apr. 30, 2009

(30) Foreign Application Priority Data

Oct. 24, 2007 (JP) ................................. 2007-276831
Oct. 1, 2008 (JP) ................................. 2008-256631

(51) Int. Cl.
*H01L 27/108* (2006.01)
*H01L 29/94* (2006.01)

(52) U.S. Cl.
USPC .......................................... 257/302; 257/133

(58) Field of Classification Search
USPC .................................................. 257/133, 302
See application file for complete search history.

(56) References Cited

U.S. PATENT DOCUMENTS

| | | | |
|---|---|---|---|
| 5,122,856 A * | 6/1992 | Komiya ........................ | 257/774 |
| 5,591,665 A * | 1/1997 | Bodensohn et al. .......... | 438/268 |
| 5,753,529 A * | 5/1998 | Chang et al. .................. | 438/118 |
| 6,365,932 B1 | 4/2002 | Kouno et al. | |
| 6,787,874 B2 * | 9/2004 | Ootera .......................... | 257/499 |
| 6,803,294 B2 | 10/2004 | Kouno et al. | |
| 6,940,144 B2 | 9/2005 | Nakayama | |
| 7,145,254 B2 | 12/2006 | Hirano et al. | |
| 7,148,125 B2 | 12/2006 | Suzuki et al. | |
| 7,385,296 B2 | 6/2008 | Ohta | |
| 7,635,892 B2 | 12/2009 | Tokuda et al. | |
| 2002/0053705 A1 * | 5/2002 | Kondo et al. ................. | 257/368 |
| 2005/0156283 A1 | 7/2005 | Tokuda et al. | |

(Continued)

FOREIGN PATENT DOCUMENTS

| JP | 59-69944 A | 4/1984 |
|---|---|---|
| JP | 63-198340 A | 8/1988 |
| JP | 02-299259 A | 12/1990 |
| JP | 03-225932 A | 10/1991 |

(Continued)

OTHER PUBLICATIONS

Notice of Reasons for Refusal mailed on Mar. 9, 2010 issued from the Japanese Patent Office in the corresponding Japanese patent application No. 2008-256631 (with English translation).

*Primary Examiner* — Thao Le
*Assistant Examiner* — Geoffrey Ida
(74) *Attorney, Agent, or Firm* — Posz Law Group, PLC

(57) ABSTRACT

A semiconductor device includes a semiconductor substrate that includes a plurality of section having different thicknesses. The sections include a first section having a first thickness and a second section having a second thickness, the second section is the thinnest section among all the sections, and the first thickness is greater than the second thickness. A plurality of isolation trenches penetrates the semiconductor substrate for defining a plurality of element-forming regions in the first section and the second section. A plurality of elements is located at respective ones of the plurality of element-forming regions. The elements include a double-sided electrode element that includes a pair of electrodes separately disposed on the first surface and the second surface, and the double-sided electrode element is located in the second section.

26 Claims, 8 Drawing Sheets

(56) References Cited

U.S. PATENT DOCUMENTS

| | | |
|---|---|---|
| 2006/0063294 A1* | 3/2006 | Hsu et al. .................... 438/57 |
| 2008/0135932 A1 | 6/2008 | Ozeki et al. |
| 2008/0164520 A1* | 7/2008 | Darwish .................... 257/334 |
| 2010/0038707 A1 | 2/2010 | Tokuda et al. |

FOREIGN PATENT DOCUMENTS

| | | |
|---|---|---|
| JP | A-11-121466 | 4/1999 |
| JP | A-2000-040833 | 2/2000 |
| JP | 2002-16266 A | 1/2002 |
| JP | 2004-281551 A | 10/2004 |

* cited by examiner

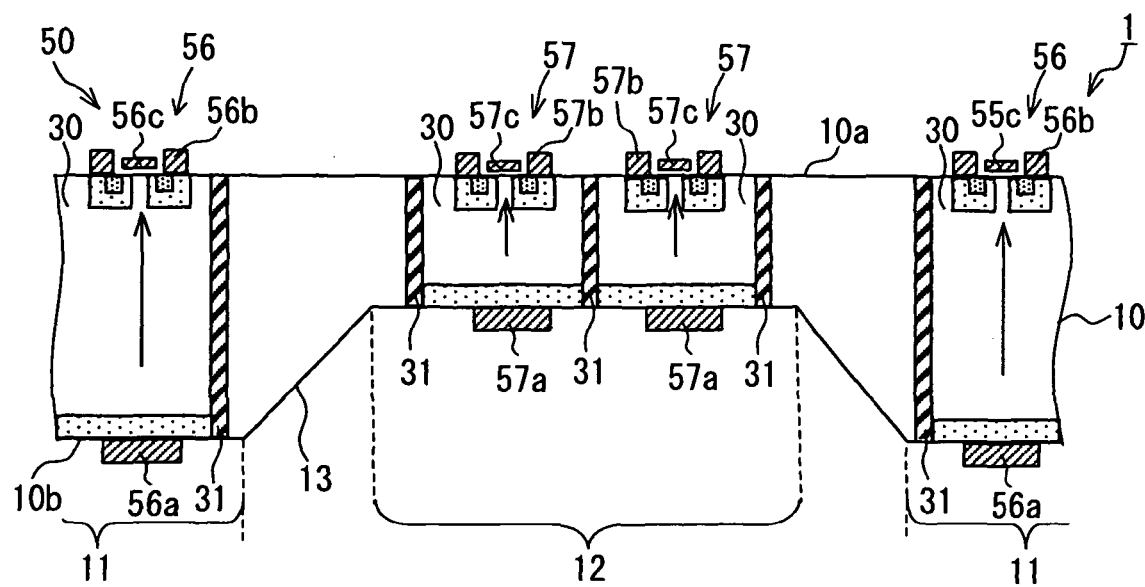

SEMICONDUCTOR DEVICE HAVING A PLURALITY OF ELEMENTS ON ONE SEMICONDUCTOR SUBSTRATE AND METHOD OF MANUFACTURING THE SAME

CROSS REFERENCE TO RELATED APPLICATIONS

The present application is based on and claims priority to Japanese Patent Applications No. 2007-276831 filed on Oct. 24, 2007 and No. 2008-256631 filed on Oct. 1, 2008, the contents of which are incorporated in their entirety herein by reference.

BACKGROUND OF THE INVENTION

1. Field of the Invention

The present invention relates to a semiconductor device having a plurality of elements on one semiconductor substrate. The present invention also relates to a method of manufacturing a semiconductor device.

2. Description of the Related Art

U.S. Pat. No. 6,365,932 (corresponding to JP-A-2001-60634) discloses a semiconductor device that has a plurality of elements on one semiconductor substrate. In the semiconductor device, a silicon-on-insulator substrate (SOI substrate) is used as the semiconductor substrate. The SOI substrate includes a silicon substrate, an embedded insulating layer made of silicon dioxide layer, and a thin silicon layer disposed on the silicon substrate through the embedded insulating layer. A plurality of trenches is provided in the silicon layer so as to extend to the embedded insulating layer and polysilicon is filled into the trenches. Thereby, isolation trenches are formed. The isolation trenches and the embedded insulating layer define a plurality of element-forming regions in the silicon layer. In the element-forming regions, n-type metal-oxide semiconductors (nMOS) and p-type metal-oxide semiconductors (PMOS) that constitute an element, for example, an up-drain type metal-oxide semiconductor field-effect transistor (up-drain type MOSFET), an NPN transistor, and a complementary metal-oxide semiconductor (CMOS), are respectively formed.

In the SOI substrate, the element-forming regions can be defined in the silicon layer by the isolation trenches and the embedded insulating layer. Thus, the SOI substrate is suitable for forming a single-sided electrode element in which a pair of electrodes is disposed on one surface of the semiconductor substrate. However, the embedded insulating layer prevents an electric current from flowing in a thickness direction of the SOI substrate. Therefore, the SOI substrate is unstable for forming a double-sided electrode element in which a pair of electrodes is separately disposed on two surfaces of the semiconductor substrate. For example, the double-side electrode element includes a vertical MOS transistor or an insulated gate bipolar transistor (IGBT) for providing a high electric power.

US-A-2008-135932 (corresponding to JP-A-2008-166705) by the inventors discloses a semiconductor device that has a plurality of elements including a double-sided electrode element on one semiconductor substrate. When the semiconductor device is manufactured, a bulk semiconductor substrate is prepared, and a plurality of blind isolation trenches extending from an upper surface of the semiconductor substrate is provided so as to surround respective element-forming regions. Then, the semiconductor substrate is polished from a lower-surface side until an end of each of the blind isolation trenches is exposed to an outside of the semiconductor substrate. Thereby, the isolation trenches penetrate the semiconductor substrate from the upper surface to the lower surface. After that, a plurality of elements is formed in the respective element-forming regions defined by the isolation trenches.

In the above-described semiconductor device, the semiconductor substrate has a uniform thickness due to the polish. Thus, in a case where a plurality of elements including a double-sided electrode element or an element in which electric current flows in the thickness direction of the semiconductor device is integrated in the semiconductor substrate, a plurality of elements having a different property, for example, a breakdown voltage and an on-resistance, is difficult to be integrated. For example, a plurality of IGBTs having a different breakdown voltage is difficult to be integrated.

Furthermore, when the uniform thickness of the semiconductor substrate is reduced for reducing the on-resistance of the double-sided electrode element, a mechanical strength of the semiconductor substrate may be reduced. Thus, the semiconductor substrate may crack when the semiconductor substrate is diced into chips or when the semiconductor substrate is carried.

SUMMARY OF THE INVENTION

In view of the foregoing problems, it is an object of the present invention to provide a semiconductor device having a plurality of elements on one semiconductor substrate. Another object of the invention is to provide a method of manufacturing a semiconductor device.

A semiconductor device according to an aspect of the invention includes a semiconductor substrate, a plurality of isolation trenches, and a plurality of elements. The semiconductor substrate has a first surface and a second surface and includes a plurality of sections having different thicknesses. The sections include a first section having a first thickness and a second section having a second thickness, the second section is the thinnest section among all the sections, and the first thickness is greater than the second thickness. The isolation trenches penetrate the semiconductor substrate from the first surface to the second surface for defining a plurality of element-forming regions therebetween. A part of the element-forming regions is provided in the first section and another part of the element-forming regions is provided in the second section. The elements are located at the respective element-forming regions. The elements include a double-sided electrode element that includes a pair of electrodes separately disposed on the first surface and the second surface, and the double-sided electrode element is located in the second section.

In the present semiconductor device, the elements having different properties can be integrated in the semiconductor substrate.

In a method of manufacturing a semiconductor device according to another aspect of the invention, a semiconductor substrate having a first surface and a second surface is prepared. The semiconductor substrate is etched from at least one of a first-surface side and a second-surface side so that a plurality of sections having different thicknesses is provided in the semiconductor substrate. The sections include a first section and a second section, the second section is the thinnest section in the plurality of sections, and the first section is thicker than the second section. A plurality of isolation trenches is formed in the first section and the second section for defining a plurality of element-forming regions in the first section and the second section. A plurality of elements is formed in the respective element-forming regions. The elements include a double-sided electrode element that has a pair of electrodes separately disposed on the first surface and the second surface, and the double-sided electrode element is formed in the second section. The semiconductor substrate is diced in such a manner that the first section and the second section integrally remain.

In the present manufacturing method, the elements having different properties can be integrated in the semiconductor substrate.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 11 is a cross-sectional view illustrating a semiconductor device according to a second embodiment;

FIG. 12 is a cross-sectional view illustrating a semiconductor device according to a modification of the second embodiment;

DETAILED DESCRIPTION OF THE PREFERRED EMBODIMENTS

First Embodiment

Figure 1:
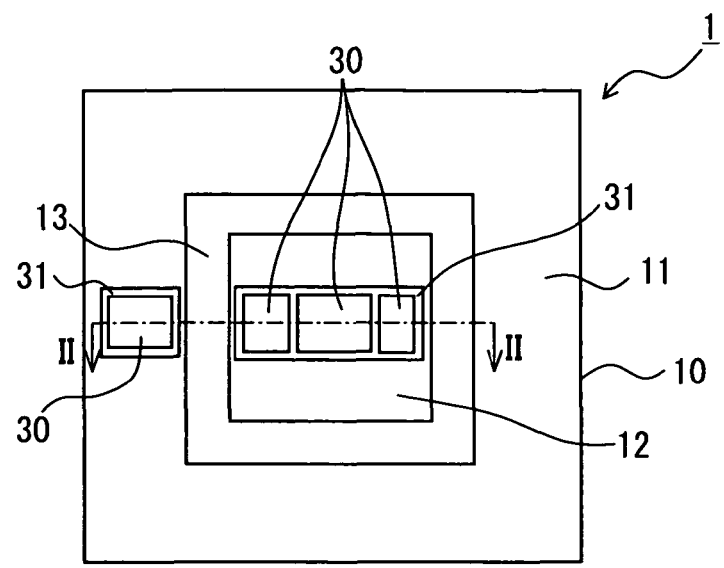
FIG. 1 is a plan view illustrating a semiconductor device according to a first embodiment.
Figure 2:
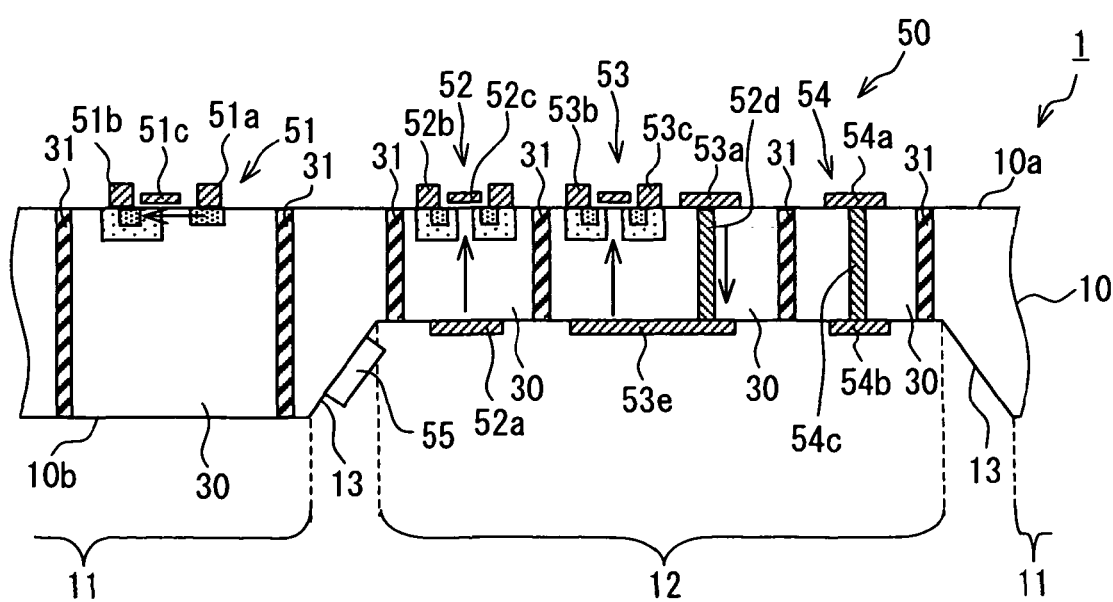
FIG. 2 is a cross-sectional view illustrating the semiconductor device taken along line II-II in FIG. 1.

A semiconductor device 1 according to a first embodiment of the invention will be described with reference to FIG. 1 and FIG. 2. In FIG. 1, only a part of a plurality of element-forming regions provided in the semiconductor device 1 is illustrated. In FIG. 2, a part of impurity regions where an impurity is implanted into a semiconductor substrate 10 is not illustrated for sake of convenience. As a plurality of elements formed in the semiconductor substrate 10, conventional elements can be used. Thus, a detail description of the elements is omitted.

The semiconductor device 1 includes the semiconductor substrate 10 made of a bulk single crystal silicon substrate having an N conductivity type (n-). The semiconductor substrate 10 has a chip shape. The semiconductor substrate 10 has a first section 11 and a second section 12. The first section 11 has a first thickness and a second section 12 has a second thickness that is less than the first thickness. In the semiconductor substrate 10, the first section 11 is the thickest section and the second section 12 is the thinnest section. The first section 11 has an approximately rectangular ring shape so as to surround the second section 12. Thus, an outer peripheral portion of the semiconductor substrate 10 provided by the first section 11 is thicker than a center portion of the semiconductor substrate 10 provided by the second section 12. The semiconductor substrate 10 has an upper surface 10a and a lower surface 10b. The semiconductor substrate 10 is treated with anisotropic etching from the lower-surface side, and thereby the second section 12 thinner than the first section 11 is provided. As illustrated in FIG. 2, a connecting portion 13 provided between the first section 11 and the second section 12 has a taper shape. That is, the thickness of the connecting portion 13 decreases toward the second section 12. The semiconductor substrate 10 has a plurality of element-forming regions 30 insulated from each other. A plurality of elements 50 is formed in the respective element-forming regions 30.

The element-forming regions 30 are insulated from each other by isolation trenches 31. The isolation trenches 31 penetrate the semiconductor substrate 10 from the upper surface 10a to the lower surface 10b and surround the respective element-forming regions 30. That is, the isolation trenches 31 define the respective element-forming regions 30 therebetween. In each of the isolation trenches 31, an insulating material, for example, silicon dioxide is filled. The element-forming regions 30 are formed on both of the first section 11 and the second section 12.

The elements 50 are formed in the respective element-forming regions 30 in the first section 11 and the second section 12. In the first section 11, a single-sided electrode element in the elements 50 is formed on the upper surface 10a of the semiconductor substrate 10. The single-sided electrode element has a pair of electrodes in which electricity flows from one electrode to the other electrode, and the pair of electrodes is disposed on the upper surface 10a of the semiconductor substrate 10. Thus, in the first section 11, the single-sided electrode element is formed so that electric current flows in a direction approximately perpendicular to a thickness direction of the semiconductor substrate 10. In the semiconductor device illustrated in FIG. 2, a lateral metal oxide semiconductor transistor (LDMOS transistor) 51 is formed on the upper surface 10a of the first section 11 as an example of the single-sided electrode element. The lateral MOS transistor 51 includes a drain electrode 51a, a source electrode 51b, and a gate electrode 51c formed on the upper surface 10a, and a driving current (drain current) flows from the drain electrode 51a to the source electrode 51b. In the second section 12, double-sided electrode elements in the elements 50 are formed. In each of the double-side electrode elements, one electrode of a pair of electrodes is formed on the upper surface 10a and the other electrode of the pair of electrodes is formed on the lower surface 10b. Thus, in the second section 12, the double-sided electrode elements are formed so that electric current flows in the thickness direction of the semiconductor substrate 10. In the present embodiment, a vertical metal oxide transistor (vertical DMOS transistor) 52, an up-drain type vertical MOS transistor 53, and a wiring element 54 are formed as examples of the double-sided electrode element. The vertical MOS transistor 52 includes a drain electrode 52a, a source electrode 52b, and a gate electrode 52c. The drain electrode 52a is disposed on the lower surface 10b and the source electrode 52b is disposed on the upper surface 10a. Thus, a drain current flows from the drain electrode 52a to the source electrode 52b in the thickness direction of the semiconductor substrate 10. The up-drain type MOS transistor 53 includes a drain electrode 53a, a source electrode 53b, a gate electrode 53c, and a rear electrode 53d. The drain electrode 53a, the source electrode 53b, and the gate electrode 53c are disposed on the upper surface 10a. The rear electrode 53d is disposed on the lower surface 10b. The drain electrode 53a and the rear electrode 53d are electrically coupled through a wiring part 53e. The wiring part 53e includes a trench, an oxide layer disposed on a sidewall of the trench, and a conductive material filled into the trench through the oxide layer. A drain current flows from the drain electrode 53a to the rear electrode 53d through the wiring part 53e and the drain current flows from the rear electrode 53d to the source electrode 53b. Thus, also in the up-drain type MOS transistor 53, the electric current flows in the thickness direction of the semiconductor substrate 10. The wiring element 54 includes a first electrode 54a, a second electrode 54b, and a wiring part 54c. The first electrode 54a is disposed on the upper surface 10a and the second electrode 54b is disposed on the lower surface 10b. The wiring part 54c includes a trench, an oxide layer disposed on a sidewall of the trench, and a conductive material filled into the trench through the oxide layer. The first electrode 54a is electrically coupled with the second electrode 54b through the wiring part 54c. In the vertical MOS transistor 52 and the up-drain type vertical MOS transistor 53, the pairs of electrodes are electrically separated from each other so that the pairs of electrodes can be driven independently.

The connecting portion 13 is insulated from the first section 11 and the second section 12 by the isolation trenches 31. On the lower surface 10b (taper surface) of the connecting portion 13, a passive element 55, for example, a capacitor or a resistance is disposed. The passive element 55 can be formed in the connecting portion 13 having the tape shape. When the passive element 55 is formed in the connecting portion 13 between the first section 11 and the second section 12, a dimension of the semiconductor device 1 can be reduced. In the present embodiment, the isolation trenches 31 for insulating the connecting portion 13 are provided in the first section 11 and the second section 12. The isolation trenches 31 for insulating the connecting portion 13 may be provided in the connecting portion 13. In a case where the isolation trenches 31 are provided in the first section 11 and the second section 12, a length of each of the isolation trenches 31 exposed to the lower surface side becomes substantially uniform. Thus, an exposed portion can be easily removed.

An exemplary method of manufacturing the semiconductor device 1 will now be described with reference to FIG. 2 to FIG. 5. A method of manufacturing a semiconductor device disclosed in US-A-2008-135932 (corresponding to JP-A-2008-166705) and a method of manufacturing a semiconductor device disclosed in Japanese Patent Application No. 2008-106014 can be applied to the present method except for a process for forming the first section 11 and the second section 12 having different thicknesses. Thus, a detail description of processes similar to the conventional manufacturing method is omitted.

Figure 3:
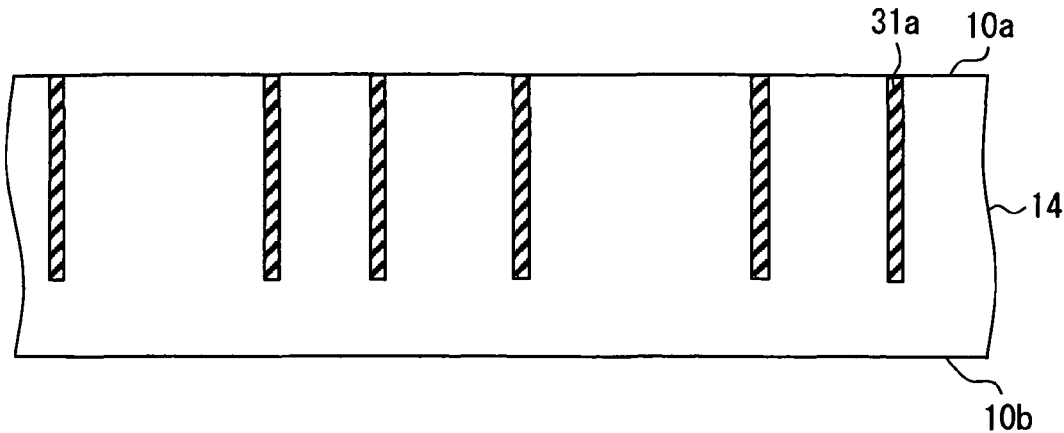
FIG. 3 is a cross-sectional view illustrating a process for providing a plurality of blind isolation trenches in a semiconductor substrate.

At first, a wafer-shaped semiconductor substrate 14 is prepared. The wafer-shaped semiconductor substrate 14 has a thickness of about 600 μm, for example. The wafer-shaped semiconductor substrate 14 is made of a single crystal bulk silicon substrate (FZ substrate) having the n conductivity type (n-). Then, as illustrated in FIG. 3, blind isolation trenches 31a having a predetermined depth are provided from the upper surface 10a of the wafer-shaped semiconductor substrate 14 (corresponding to the upper surface 10a of the semiconductor substrate 10 after dicing) so that the blind isolation trenches 31 do not reach the lower surface 10b. The blind isolation trenches 31a do not penetrate through the wafer-shaped semiconductor substrate 14. The blind isolation trenches 31a are filled with the insulating material, for example, silicon dioxide. The blind isolation trenches 31a have substantially uniform depth and substantially uniform width.

Figure 4:
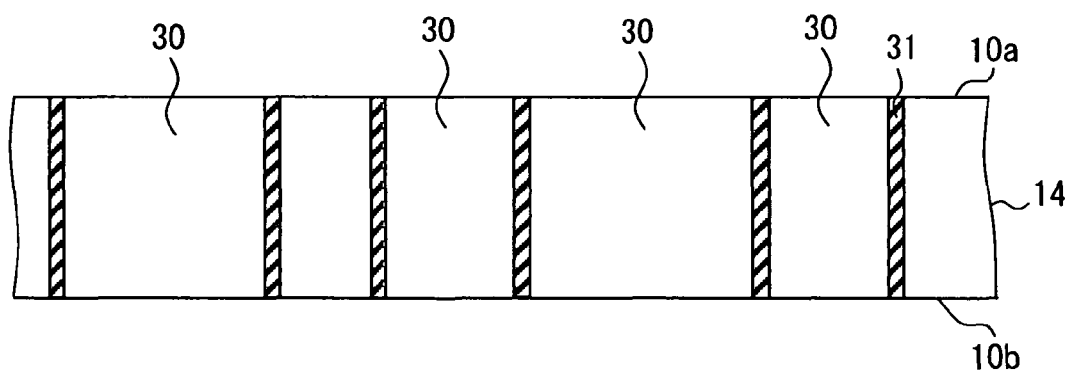
FIG. 4 is a cross-sectional view illustrating a process for making the isolation trenches penetrate through a substrate.

Next, as illustrated in FIG. 4, the thickness of the wafer-shaped semiconductor substrate 14 is reduced from the lower-surface side until an end of each of the blind isolation trenches 31a is exposed to an outside of the wafer-shaped semiconductor substrate 14. The thickness of the wafer-shaped semiconductor substrate 14 is reduced, for example, by mechanical polishing or etching. In the present example, the wafer-shaped semiconductor substrate 14 is mechanically polished at first. Then, a polished surface is treated with wet etching for removing a damage layer generated at the mechanical polishing. Thereby, the thickness of the wafer-shaped semiconductor substrate 14 becomes substantially equal to the thickness of the first section 11 of the semiconductor substrate 10 after dicing. In addition, the blind isolation trenches 31a become the isolation trenches 31 that penetrate through the wafer-shaped semiconductor substrate 14 from the upper surface 10a to the lower surface 10b. The isolation trenches 31 define the respective element-forming regions 30 therebetween. Thus, the element-forming regions 30 are insulated from each other by the isolation trenches 31.

Figure 5:
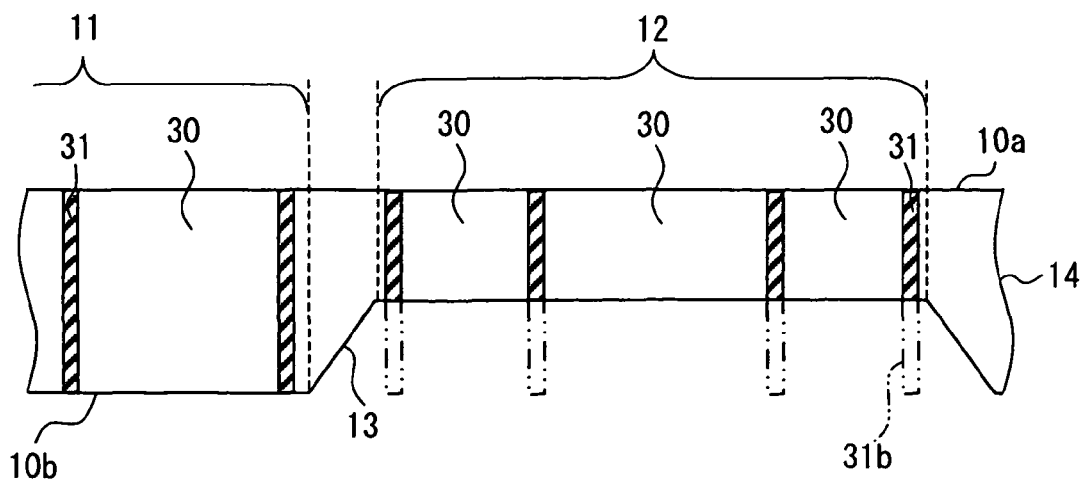
FIG. 5 is a cross-sectional view illustrating a process for forming a plurality of sections having different thicknesses in the semiconductor substrate.

Next, as illustrated in FIG. 5, the wafer-shaped semiconductor substrate 14 is selectively etched from the lower-surface side so as to provide the first sections 11 and the second sections 12 having different thicknesses. For example, the wafer-shaped semiconductor substrate 14 is treated with anisotropic wet etching or anisotropic dry etching. In the present example, the wafer-shaped semiconductor substrate 14 is treated with anisotropic wet etching using a potassium hydroxide (KOH) aqueous solution. Thereby, a predetermined portion of the wafer-shaped semiconductor substrate 14 is selectively removed from the lower surface side. As a result, the wafer-shaped semiconductor substrate 14 has the first sections 11 that are not etched, the second sections 12 that become thinner than the first sections 11 by the anisotropic wet etching, and the connecting portions 13 that are located between the first sections 11 and the second sections 12.

In the above-described anisotropic wet etching, the predetermined portion of the wafer-shaped semiconductor substrate 14 that is made of silicon can be removed. However, the insulating material (e.g., silicon dioxide) in the isolation trenches 31 located at the predetermined portion of the wafer-shaped semiconductor substrate 14 is difficult to be etched. Thus, the insulating material remains as columns 31b protruding from the lower surface 10b of the second sections 12. The columns 31b are removed by hydrofluoric acid (HF) treatment after the anisotropic wet etching is performed.

After forming the first sections 11 and the second sections 12, the elements 50 are formed in the respective element-forming regions 30, as illustrated in FIG. 2. In the present example, at first, the single-sided electrode elements including the lateral MOS transistors 51 and upper-surface side components of the double-sided electrode elements including the vertical MOS transistors 52, the up-drain type vertical MOS transistors 53, and the wiring elements 54 are formed on the upper surface 10a, for example, by ion implantation. Next, lower-surface side components of double-sided electrode elements including the vertical MOS transistors 52, the up-drain type vertical MOS transistors 53, and the wiring elements 54 are formed on the lower surface 10b, for example, by ion implantation. Then, the wafer-shaped semiconductor substrate 14 is diced at predetermined portions of the first sections 11, and thereby the semiconductor device 1 that has the semiconductor substrate 10 including the first section 11 and the second section 12 is formed.

In the present semiconductor device 1, the semiconductor substrate 10, which is diced into the chips, includes the first section 11 and the second section 12 having different thicknesses. In addition, the element-forming regions 30 and the elements 50 are formed in both of the first section 11 and the second section 12. Thus, the elements 50 including the lateral MOS transistor 51, the vertical MOS transistor 52, the up-drain type vertical MOS transistor 53, and the wiring element 54 can be selectively formed in the first section 11 or the second section 12 in accordance with the property of each of the elements 50 such as a breakdown voltage and an on-resistance. In the present semiconductor device 1, the double-sided electrode elements including the lateral MOS transistor 51, the vertical MOS transistor 52, the up-drain type vertical MOS transistor 53, and the wiring element 54 are formed in the second section 12 that is the thinnest section in the semiconductor substrate 10. Thus, electric current easily flows between the pair of electrodes in the double-sided electrode elements. As a result, in the present semiconductor device 1, the elements 50 having different property can be integrated even if the elements 50 include double-sided electrode elements. The present semiconductor device 1 is a composite integrate circuit that has the double-sided electrode elements and the single-sided electrode element integrated on one semiconductor substrate 10.

In the present semiconductor device 1, the vertical MOS transistor 52 and the up-drain type MOS transistor 53, which are examples of the double-sided electrode element, are formed in the second section 12 that is the thinnest section in the semiconductor substrate 10. Thus, the on-voltage of the vertical MOS transistor 52 and the one-voltage of the up-drain type MOS transistor 53 can be reduced.

The on-voltage of each of the double-sided electrode elements is reduced when the thickness of semiconductor substrate 10 is reduced. However, if the semiconductor substrate 10 has a uniform thickness equal to the thickness of the second section 12, a mechanical strength of the semiconductor substrate 10 is reduced. Thus, the semiconductor substrate 10 may crack when the wafer-shaped semiconductor substrate 14 is diced or when the semiconductor substrate 10 after dicing is carried. If the thickness of the semiconductor substrate 10 is increased for improving the mechanical strength, the on-resistance is difficult to be reduced. The present semiconductor device 1 includes the first section 11 that is thicker than the second section 12. Thus, the mechanical strength of the semiconductor substrate 10 is improved.

In the semiconductor substrate 10 that is diced into the chips, a crack can possibly generate from an end portion of the semiconductor substrate 10. The first section 11 that is thicker than the second section 12 has the rectangular ring shape so as to surround the second section 12. Thus, a crack is difficult to generate in the semiconductor substrate 10. In addition, because the first section 11 is located at the outer peripheral portion of the semiconductor substrate 10, the semiconductor device 1 can be stably mounted on a circuit substrate (not shown).

In the present embodiment, the semiconductor substrate 10 is made of the single crystal bulk silicon substrate. By providing the isolation trenches 31, the element-forming regions 30 and the elements 50 are isolated from each other. Thus, the double-sided electrode element including the vertical MOS transistor 52 can be effectively formed in the semiconductor substrate 10. In addition, in each of the double-sided electrode elements, the electric current and the breakdown voltage for a surge of electrostatic discharge can be effectively increased. Furthermore, because the semiconductor device 1 does not include an embedded insulating layer like an SOI substrate, a radiation performance of the semiconductor device 1 can be improved.

In the present embodiment, the element-forming regions are insulated from each other by providing the isolation trenches 31 in the semiconductor substrate 10. In addition, the pairs of electrodes of the vertical MOS transistor 52 and the up-drain type vertical MOS transistor 53 are electrically separated from each of each other so that the pairs of electrodes can be driven independently from each other. Therefore, the semiconductor device 1 has a multichannel structure. Alternatively, the electrodes disposed on the lower surface 10b of the semiconductor substrate 10 may be shared.

In the present embodiment, the double-sided electrode elements include the vertical MOS transistor 52, the up-drain type vertical MOS transistor 53, and the wiring element 54. As a power element, an IGBT may also be formed without being limited to the vertical MOS transistor 52 and the up-drain type vertical MOS transistor 53. As an active element, a diode may also be formed without being limited to the vertical MOS transistor and the IGBT. As a passive element, a resistance may also be formed without being limited to the wiring element 54. In the semiconductor device 1 illustrated in FIG. 2, the wiring element 54 includes the wiring part 54c in which the conductive material is filled into the trench through the oxide-layer disposed on the sidewall of the trench. The wiring element 54 may have other configuration without the wiring part 54c.

In the present semiconductor device 1, the lateral MOS transistor 51 is formed as an example of the single-sided electrode element. The single-sided electrode element may include one of a bipolar transistor, a lateral MOS transistor, and a complementary MOS transistor. The single-sided electrode element can be formed with the double-side electrode element such as the vertical MOS transistor and the IGBT so as to configure a composite integrate circuit. The diode as the active element, the capacitor, the resistance, and the wiring as the passive element may also be formed.

In the semiconductor device 1 illustrated in FIG. 2, the semiconductor substrate 10 has the first section 11 and the second section 12 that have the different thicknesses. The number of sections having different thicknesses may be larger than two. In the semiconductor device 1 illustrated in FIG. 2, the single-sided electrode element is formed in the first section 11 and the double-sided electrode elements are formed in the second section 12. Alternatively, the double-sided electrode elements may be formed in the first section 11 with the single-sided electrode element, or the single-sided electrode elements may be formed in the second section 12 with the double-sided electrode elements. In the semiconductor device 1, the semiconductor substrate 10 has a plurality of sections each having a different thickness, the element-forming regions are formed in at least two sections, and at least one double-sided electrode element is formed in the thinnest section.

Figure 6:
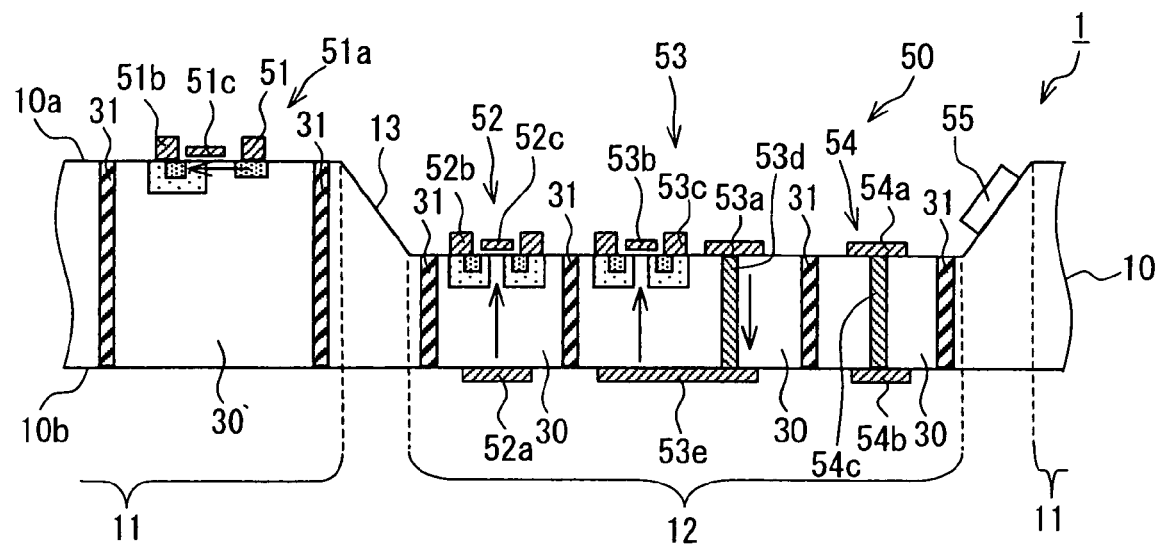
FIG. 6 is a cross-sectional view illustrating a semiconductor device according to a first modification of the first embodiment.

In the above-described manufacturing method, the wafer-shaped semiconductor substrate 14 is treated with the anisotropic etching from the lower-surface side so that the second section 12 becomes thinner than the first section 11. Then, the drain electrode 51a, the source electrode 51b, and the gate electrode 51c of the lateral MOS transistor 51 are formed on the upper surface 10a of the first section 11, and the source electrode 52b and the gate electrode 52c of the vertical MOS transistor 52 are formed on the upper surface 10a of the second section 12. In addition, the drain electrode 52a of the vertical MOS transistor 52 is formed on the lower surface 10b of the second section 12. The semiconductor substrate 10 has a recess portion on the lower surface 10b at the second section 12 with respect to the lower surface 10b of the first section 11. Alternatively, the wafer-shaped semiconductor substrate 14 may be treated with anisotropic etching from the upper surface side so that the second section 12 becomes thinner than the first section 11. Then, the drain electrode 51a, the source electrode 51b, and the gate electrode 51c of the lateral MOS transistor 51 and the source electrode 52b and the gate electrode 52c of the vertical MOS transistor 52 may be formed on the upper surface 10a and the drain electrode 52a of the vertical MOS transistor 52 may be formed on the lower surface 10b, as illustrated in FIG. 6. That is, the semiconductor device 1 may have a reverse configuration of the semiconductor device 1 illustrated in FIG. 2, and the semiconductor substrate 10 may have a recess portion on the upper surface 10a at the second section 12 with respect to the upper surface 10a at the first section 11. In the present case, the upper-surface side components of the elements 50 are formed on the upper surface 10a after the first section 11 and the second section 12 are provided. Alternatively, the wafer-shaped semiconductor substrate 14 may be treated with anisotropic etching from the upper surface side and the lower surface side so that the second section 12 becomes thinner than the first section 11. That is, recess portions may be provided on both of the upper surface side and the lower surface side of the semiconductor substrate 10. In a case where the recess portions are provided in such a manner that a part of the recess portion provided on the upper surface side overlaps a part of the recess portion provided on the lower surface side in a direction perpendicular to a thickness direction of the semiconductor substrate 10, the thickness of the second section 12 can be reduced at the overlapped part compared with the non-overlapped part.

Figure 7:
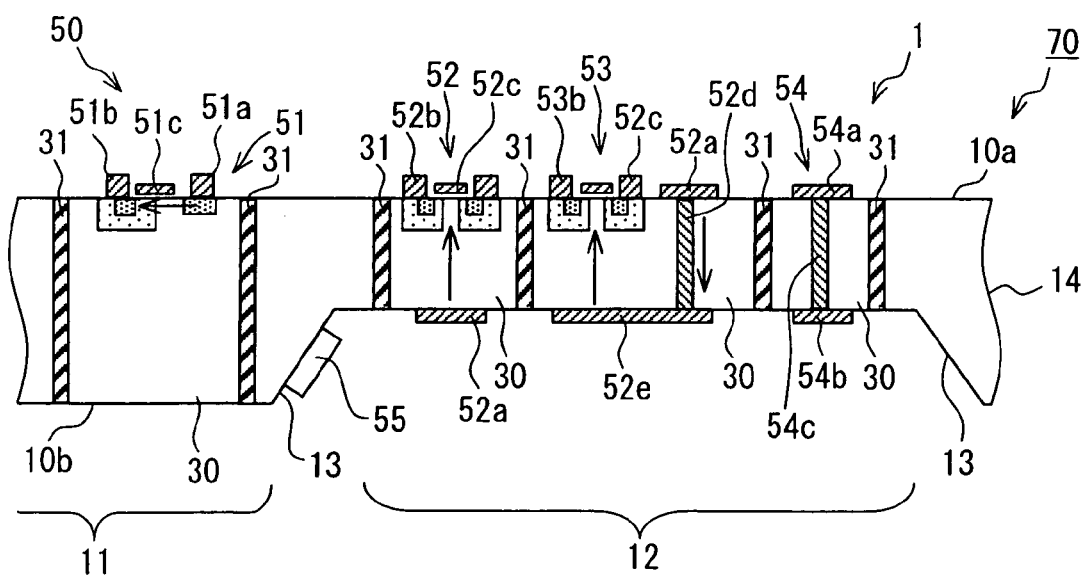
FIG. 7 is a cross-sectional view illustrating a semiconductor device according to a second modification of the first embodiment.

The semiconductor device 1 illustrated in FIG. 2 includes the semiconductor substrate 10 that is diced into the chips. The above-described configuration may be applied to a semiconductor device 70 that includes the wafer-shaped semiconductor substrate 14. As illustrated in FIG. 7, the wafer-shaped semiconductor substrate 14 has the first section 11 and the second section 12, and the element-forming regions 30 are formed in both of the first section 11 and the second section 12. The double-sided electrode elements including the vertical MOS transistor 52, the up-drain type MOS transistor 53, and the wiring elements 54 are formed in the second section 12 that is the thinnest section in the wafer-shaped semiconductor substrate 14. Also in the semiconductor device 70, the elements 50 having different properties can be integrated and the mechanical strength of the wafer-shaped semiconductor substrate 14 can be improved. If the whole area of the wafer-shaped semiconductor substrate 14 has a uniform thickness equal to the second section 12, the wafer-shaped semiconductor substrate 14 may crack easier than the chip-shaped semiconductor substrate 10, for example, at a time when the wafer-shaped semiconductor substrate 14 is diced, because the wafer-shaped semiconductor substrate 14 is larger than the chip-shaped semiconductor substrate 10. Thus, in the semiconductor device 70 that includes the wafer-shaped semiconductor substrate 14, the mechanical strength can be effectively improved by providing the first section 11 compared with the semiconductor device 1 that includes the chip-shaped semiconductor substrate 10.

In the manufacturing method illustrated in FIG. 3-FIG. 5, the elements 50 are formed on the upper surface 10a and the lower surface 10b of the wafer-shaped semiconductor substrate 14 after the first section 11 and the second section 12 are provided. The upper-surface side components of the elements 50 may be formed on the upper surface 10a before the first section 11 and the second section 12 are provided. In the present case, the upper-surface side components of the elements 50 may be formed before or after the isolation trenches 31 are provided. Alternatively, a P type impurity may be ion-implanted partially in the wafer-shaped semiconductor substrate 14 from the lower surface side before the first section 11 and the second section 12 are provided, and an interface of a PN junction part may used as a stopper at the etching. Alternatively, an epitaxial layer having a P type conductivity may be formed on the silicon substrate having the N type conductivity, and an interface between the silicon substrate and the epitaxial layer (i.e., PN junction part) may be used as a stopper at the etching.

Figure 8:
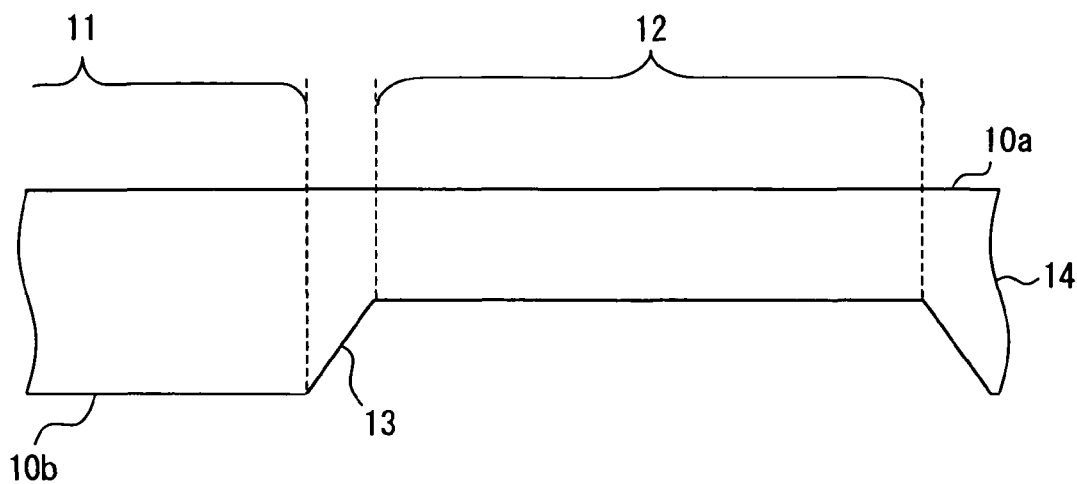
FIG. 8 is a cross-sectional view illustrating a part of a manufacturing process according to a third modification of the first embodiment.
Figure 9:
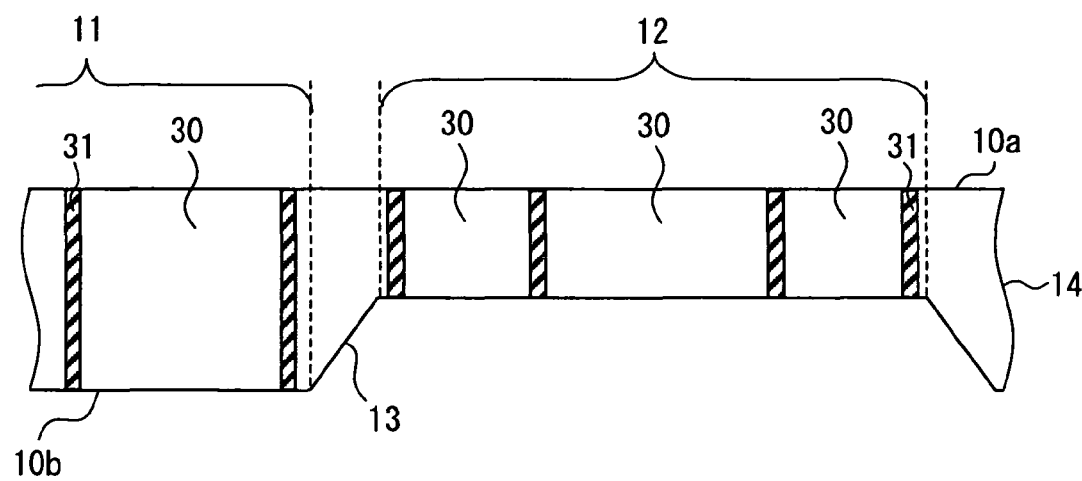
FIG. 9 is a cross-sectional view illustrating another part of the manufacturing process according to the third modification of the first embodiment.

Alternatively, the first section 11 and the second section 12 may be provided in the wafer-shaped semiconductor substrate 14 before the isolation trenches 31 are formed, as illustrated in FIG. 8. Then, as illustrated in FIG. 9, the isolation trenches 31 may be provided from the lower-surface side of the wafer-shaped semiconductor substrate 14 by using an interlayer insulating layer such as a boron phosphorous silicon glass (BPSG) layer or a local oxidation of silicon (LOCOS) layer as a stopper. In the present method, a process for reducing the thickness of the wafer-shaped semiconductor substrate 14 so that the end of each of the isolation trenches 31 is exposed is not required. Furthermore, because the thickness of the wafer-shaped semiconductor substrate 14 is reduced before the first section 11 and the second section 12 are provided, a process for removing the columns 31b is not required. In FIG. 8 and FIG. 9, the elements 50 are not illustrated for sake of convenience.

In the manufacturing method illustrated in FIG. 3-FIG. 5, the wafer-shaped semiconductor substrate 14 is diced at the predetermined positions (not shown) of the first sections 11 so as to form the semiconductor device 1 that has the semiconductor substrate 10 including the first section 11 and the second section 12. Alternatively, the wafer-shaped semiconductor substrate 14 may further includes a third section 15 that is thicker than the first section 11. The elements 50 are not formed in the third section 15. The third section 15 and a connecting portion between the first section 11 and the third section 15 are removed by dicing the wafer-shaped semiconductor substrate 14 along dashed lines 71 illustrated in FIG. 10, and thereby the semiconductor device 1 that has the semiconductor substrate 10 including the first section 11 and the second section 12 can be formed. Because the third section 15 thicker than the first section 11 is provided until the wafer-shaped semiconductor substrate 14 is deiced into the chips, the mechanical strength of the wafer-shaped semiconductor substrate 14 before dicing can be further improved.

In the semiconductor device illustrated in FIG. 2, the isolation trenches 31 are formed by filling the insulating material into trenches. The isolation trenches 31 may be other configuration. For example, an oxide layer may be disposed on sidewalls of the trenches and a conductive material may be filled into the trenches through the oxide layer. Alternatively, the isolation trenches 31 may be hollow trenches.

Second Embodiment

A semiconductor device 1 according to a second embodiment of the invention will be described with reference to FIG. 11. Because the present semiconductor device 1 has many portions in common with the above-described semiconductor device 1, a description of the common portions will be omitted and different portions will be mainly described.

In the present semiconductor device 1, the semiconductor substrate 10 has the first section 11 and the second section 12 having the different thicknesses. In both of the first section 11 and the second section 12, double-sided electrode elements are formed.

For example, IGBTs 56 having a breakdown voltage of about 1000 V is formed in the first section 11 and IGBTs 57 having a breakdown voltage less than that of IGBT 56 (e.g., about 500V) is formed on the second section 12 that is thinner than the first section 11. Collector electrodes 56a of the IGBTs 56 and collector electrodes 57a of the IGBT 57s are formed on the lower surface 10b of the semiconductor substrate. Emitter electrodes 56b and gate electrodes 56c of the IGBTs 56 and emitter electrodes 57b and gate electrodes 57c of the IGBTs 57 are formed on the upper surface 10a of the semiconductor substrate 10. A driving electric current flows from each of the collector electrodes 56a and 57a to the corresponding one of the emitter electrodes 56b and 57b in the thickness direction of the semiconductor substrate 10.

In the present embodiment, the element-forming regions 30 are insulated from each other by providing the isolation trenches 31 in the semiconductor substrate 10. The pair of electrodes in each of the IGBTs 56 and 57 is electrically separated from each other. Thus, the present semiconductor device 1 can have a multichannel structure.

The semiconductor substrate 10 has the first section 11 and the second section 12 having the different thicknesses, and the IGBTs 56 and 57 are formed on the first section 11 and the second section 12, respectively. Thereby, the IGBTs 56 and the IGBTs 57 can have the different breakdown voltages in accordance with the thicknesses of the first section 11 and the second section 12. Thus, the IGBTs 56 and 57 having the different breakdown voltages can be integrated in the semiconductor substrate 10.

In the semiconductor device 1 illustrate in FIG. 11, the semiconductor substrate 10 has the first section 11 and the second section 12 having the different thicknesses and the IGBTs 56 and 57 are formed on the first section 11 and the second section 12, respectively. The semiconductor substrate 10 may have a plurality of sections greater than two having different thicknesses and the IGBTs may be formed in at least two sections including the thinnest section. For example, the semiconductor substrate 10 may include the first section 11, a thin second section 12a, and a thick second section 12b, as illustrated in FIG. 12. The thick second section 12b is thicker than the thin second section 12a, and the first section 11 is thicker than the thick second section 12b. That is, in the semiconductor device 1 illustrated in FIG. 12, the first section 11 is the thickest section and the thin second section 12a is the thinnest section. In the thin second section 12a and the thick second section 12b, IGBT 58 and IGBTs 59 are respectively formed. Specifically, a collector electrode 58a of the IGBT 58 is formed on the lower surface 10b of the thin second section 12a, and an emitter electrode 58b and a gate electrode 58c of the IGBT 58 are formed on the upper surface 10a of the thin second section 12a. In addition, collector electrodes 59a of the IGBTs 59 are formed on the lower surface 10b of the thick second section 12b, and emitter electrodes 59b and gate electrodes 59c of the IGBTs 59 are formed on the upper surface 10a of the thick second section 12. Thus, the IGBTs 58 and 59 having different breakdown voltages are integrated in the semiconductor substrate 10. The elements 50 are not formed in the first section 11. The first section 11 is provided for ensuring the mechanical strength of the semiconductor substrate 10. In this way, the elements 50 may not be formed in one of the sections. In the semiconductor substrate 10, the thin second section 12a is surrounded by the thick second section 12b, and the thick second section 12b is surrounded by the first section 11. Thus, the thickness of the semiconductor substrate 10 increases toward the outer peripheral side of the semiconductor substrate 10. A plurality of sections greater than two each having a different thickness can be formed by etching the semiconductor substrate 10 in a plurality of stages. Alternatively, a plurality of sections greater than two having different thicknesses can be formed by using a plurality of masks having unequal-sized openings. In the present case, the etching is performed with the masks so that the respective sections have different etching depths.

In the semiconductor device illustrated in FIG. 12, the elements 50 are formed in the thin second section 12a and the thick second section 12b. Alternatively, the elements 50 may not be formed in the thick second section 12b. That is, the elements 50 may not be formed in one of the sections of the semiconductor substrate 10 other than the thinnest section.

Alternatively, the double-sided electrode elements may be formed in each of a plurality of sections greater than two. For example, IGBTs having different breakdown voltages may be formed in respective sections greater than two, for example, in the first section 11, the thin second section 12a, and the thick second section 12b illustrated in FIG. 12, in accordance with a thickness of each of the sections.

In the semiconductor device illustrated FIG. 11 and FIG. 12, the IGBTs are formed as an example of the double-sided electrode elements. Alternatively, the double-side electrode elements may include at least one of a vertical MOS transistor and an IGBT. For example, in the three sections 11, 12a, and 12b of the semiconductor substrate 10 illustrated in FIG. 12, a vertical MOS transistor may be formed in the thin second section 12a so that an on-resistance of the vertical MOS transistor is reduced and IGBTs may be respectively formed in the thick second section 12b and the first section 11. In addition, a diode, a resistance, and a wiring element may be formed in the semiconductor substrate 10.

In the semiconductor devices 1 illustrated in FIG. 11 and FIG. 12, the elements 50 include only the double-side electrode elements (i.e., the IGBTs). Alternatively, the semiconductor devices 1 may be include both the double-side electrode element and a single-sided electrode element in a manner similar to the semiconductor device 1 illustrated in FIG. 2. For example, a single-sided electrode element such as a lateral MOS transistor may be formed in the first section 11. In the present case, the semiconductor device 1 may be a composite integrated circuit.

Each of the semiconductor devices 1 illustrated in FIG. 11 and FIG. 12 includes the chip-shaped semiconductor substrate 10. Alternatively, the above-described configuration may be applied to a semiconductor device 70 that includes a wafer-shaped semiconductor substrate 14 in a manner similar to the semiconductor device 1 illustrated in FIG. 7.

Third Embodiment

A semiconductor device 1 according to a third embodiment of the invention will be described with reference to FIG. 13. Because the present semiconductor device 1 has many portions in common with the above-described semiconductor devices 1, a description of the common portions will be omitted and different portions will be mainly described.

In the above-described semiconductor devices 1, the semiconductor substrate 10 has a recess portion on at least one surface at the thinnest section with respect to the one surface at the thickest section. For example, in the semiconductor device 1 illustrated in FIG. 2, the semiconductor substrate 10 has the recess portion one the lower surface 10b at the second section 12 with respect to the lower surface 10b at the first section 11. Thus, a member other than the semiconductor substrate 10 may be mounted on the surface of the thinnest section so as to be housed in the recess portion. In this configuration, the recess portion can be used as a space for housing the member other than the semiconductor substrate 10. Thus, the dimension of the semiconductor device 1 that includes the semiconductor substrate 10 and the member can be reduced.

Figure 13:
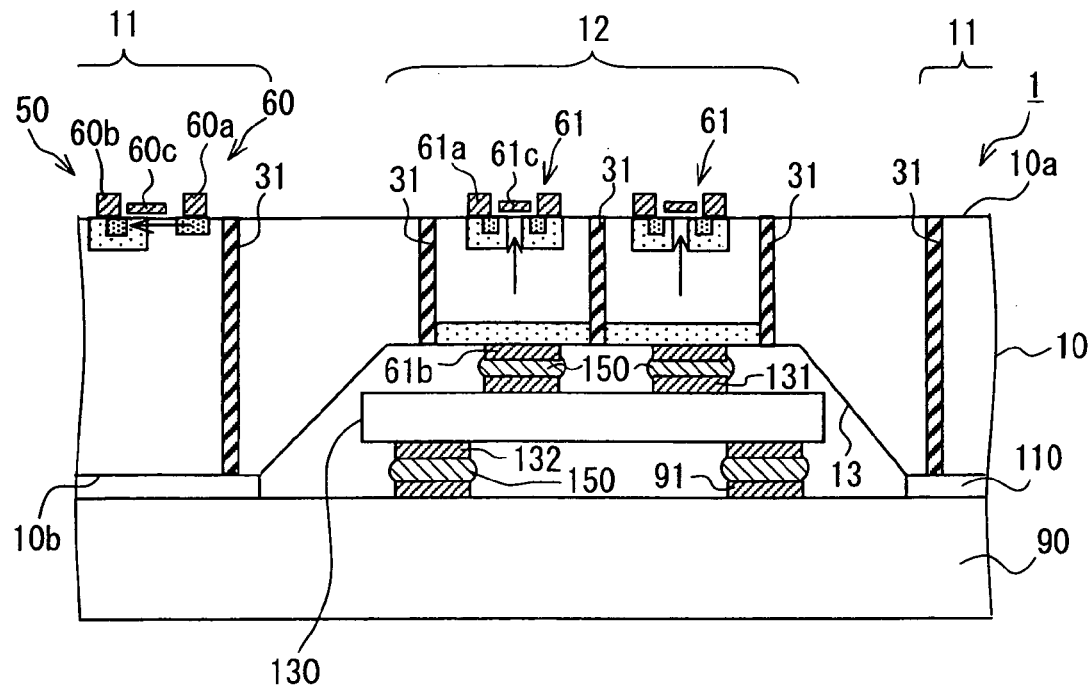
FIG. 13 is a cross-sectional view illustrating a semiconductor device according to a third embodiment.

In the semiconductor device 1 illustrated in FIG. 13, the semiconductor substrate 10 having the chip-shape includes the first section 11 and the second section 12. A single-sided electrode element, for example, a lateral MOS transistor 60 is formed at the first section 11, and a drain electrode 60a, a source electrode 60b, and a gate electrode 60c of the lateral MOS transistor 60 are formed on the upper surface 10a of the first section 11. Double-sided electrode elements, for example, IGBTs 61 are formed at the second section 12. Collector electrodes 61b are disposed on the lower surface 10b of the second section 12, and emitter electrodes 61a and gate electrode 61c are disposed on the upper surface 10a of the second section 12. An adhesive member 110 is disposed between the lower surface 10b of the first section 11 and an upper surface of a circuit board 90, and thereby the semiconductor device 1 is fixed to the circuit board 90. A wiring substrate 130 is mounted on the lower surface 10b of the second section 12 so as to be housed in the recess portion of the semiconductor substrate 10. A plurality of lands 131 is disposed on an upper surface of the wiring substrate 130 the second section 12. The lands 131 are electrically coupled with the respective collector electrodes 61b of the IGBTs 61 through a connecting member 150. For example, the connecting member 150 is made of solder. A plurality of lands 132 is disposed on a lower surface of the wiring substrate 130. A plurality of lands 91 is disposed on the upper surface of the circuit board 90. The lands 132 are electrically coupled with the respective lands 91 through the connecting member 150.

In the present case, the dimension of the semiconductor device 1 including the semiconductor substrate 10 and the wiring substrate 130 can be reduced. The semiconductor substrate 10 is mounted on the circuit board 90 in such a manner that a surface on a side where the recess portion is provided, for example, the lower surface 10b in FIG. 13, faces the circuit board 90. In addition, the collector electrodes 61b of the IGBTs 61 disposed on the lower surface 10b of the second section 12 are electrically coupled with the lands 91 disposed on the circuit board 90.

A member housed in the recess portion of the semiconductor substrate 10 is not limited to the wiring substrate 130. In a semiconductor device 1 illustrated in FIG. 14, the collector electrodes 61b of the IGBTs 61 disposed on the lower surface 10b of the semiconductor substrate 10 extend from the second section 12 to the first section 11 through the connecting portion 13 having the taper shape. The lands 91 are disposed on the upper surface of the circuit board 90. The collector electrodes 61b are electrically coupled with the respective lands 91 through the connecting member 150 at the first section 11. A heat sink 170 is housed in the recess portion of the semiconductor substrate 10 provided on the lower surface 10b of the second section 12. The heat sink 170 is fixed to portions of the collector electrodes 61b located at the second section 12 through an insulating member 171.

In the present case, the dimension of the semiconductor device 1 that includes the semiconductor substrate 10 and the heat sink 170 can be reduced. The semiconductor substrate 10 is mounted on the circuit board 90 in such a manner that a surface on a side where the recess portion is provided, for example, the lower surface 10b in FIG. 14, faces the circuit board 90. The collector electrodes 61b of the IGBTs 61 disposed on the lower surface 10b of the semiconductor substrate 10 are electrically coupled with the lands 91 disposed on the circuit board 90. In the semiconductor device illustrated in FIG. 14, the wiring substrate 130 is not required, and the heat sink 170 can be housed in the recess portion of the semiconductor substrate 10. Thus, in a case where a power element, for example, the IGBTs 61 illustrated in FIG. 14 are formed at the second section 12 as double-sided electrode elements, a radiation performance of the semiconductor device 1 can be improved.

Figure 15:
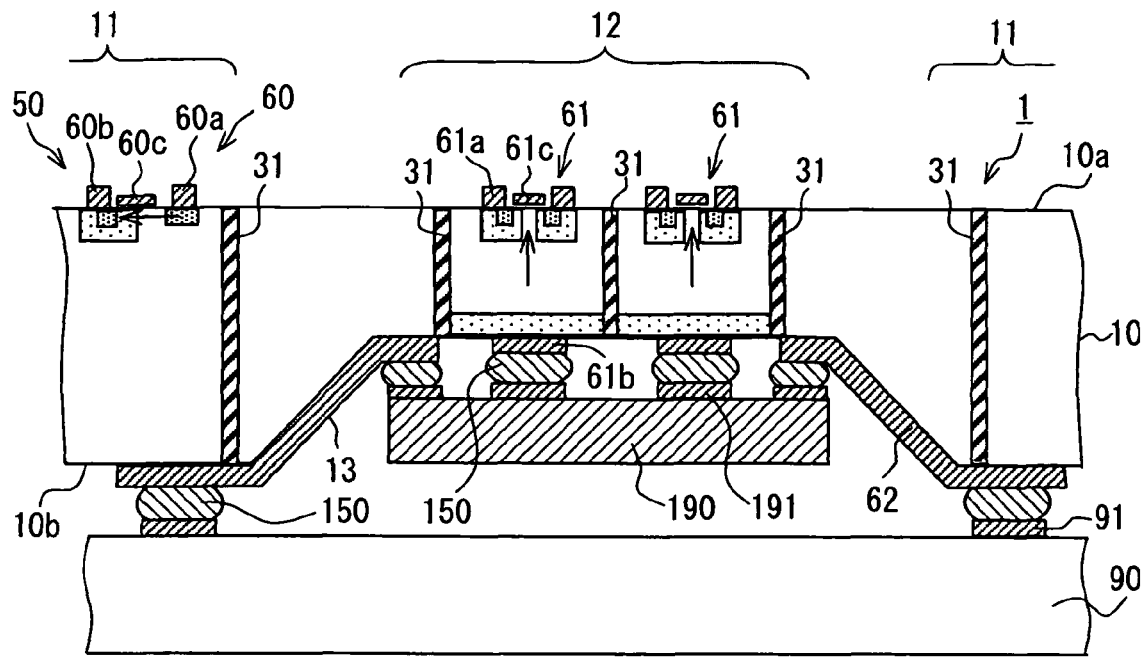
FIG. 15 is a cross-sectional view illustrating a semiconductor device according to a second modification of the third embodiment.

In a semiconductor device 1 illustrated in FIG. 15, an integrated circuit (IC) chip 190 other than the semiconductor substrate 10 is housed in the recess portion provided on the rear-surface side of the second section 12. A plurality of electrodes 191 is disposed on an upper surface of the IC chip 190. A part of the electrodes 191 is electrically coupled with the respective collector electrodes 61b of the IGBTs 61 through the connecting member 150. The other part of the electrodes 191 of the IC chip 190 is electrically separated from the collector electrodes 61b. Wiring members 62 are disposed on the lower surface 10b of the semiconductor substrate 10 so as to extend from the second section 12 to the first section 11 through the connecting portion 13. The other part of the electrodes 191 of the IC chip 190 is electrically coupled with the respective wiring members 62 through the connecting member 150. At the first section 11, the wiring members 62 are electrically coupled with the respective lands 91 of the circuit board 90 through the connecting member 150.

In the present case, the dimension of the semiconductor device 1 that includes the semiconductor substrate 10 and the IC chip 190 can be reduced. The semiconductor substrate 10 is mounted on the circuit board 90 in such a manner that a surface on a side where the recess portion is provided, for example, the lower surface 10b in FIG. 15, faces the circuit board 90. The collector electrodes 61b of the IGBTs 61 disposed on the lower surface 10b of the second section 12 are electrically coupled with the lands 91 disposed on the circuit board 90 through the IC chip 190 and the wiring members 62.

Figure 14:
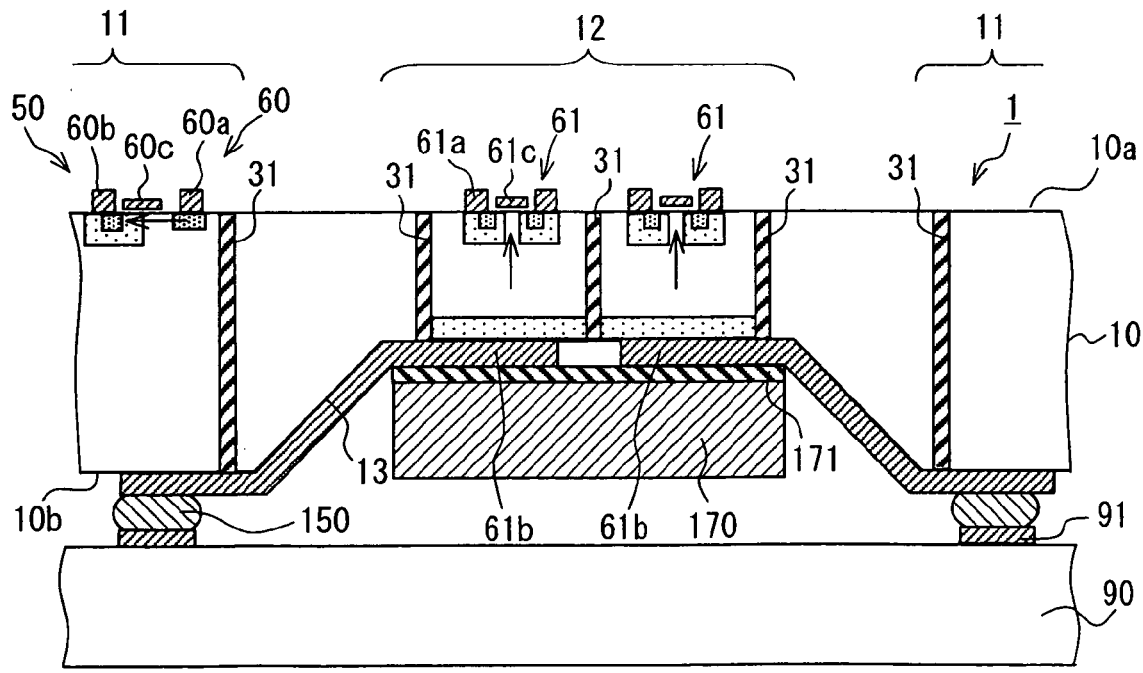
FIG. 14 is a cross-sectional view illustrating a semiconductor device according to a first modification of the third embodiment.

In examples of a mounting structure illustrated in FIG. 13-FIG. 15, the semiconductor device 1 including the semiconductor substrate 10 and another member is mounted on the circuit board 90. A mounting structure of the semiconductor device 1 is not limited to the above-described examples. In a semiconductor device 1 including the semiconductor substrate 10 and another member, when another member, for example, the wiring substrate 130, the heat sink 170, or the IC chip 190, is mounted on at least a surface of a thin section of the semiconductor substrate 10 so as to be housed in the recess portion of the semiconductor substrate 10, the dimension of the semiconductor device 1 can be reduced.

Fourth Embodiment

A semiconductor device 1 according to a fourth embodiment of the invention will be described with reference to FIG. 16-FIG. 19. Because the present semiconductor device 1 has many portions in common with the above-described semiconductor devices 1, a description of the common portions will be omitted and different portions will be mainly described. In FIG. 16-FIG. 19, the elements 50 formed in the semiconductor substrate 10 are not illustrated for sake of convenience.

Figure 16:
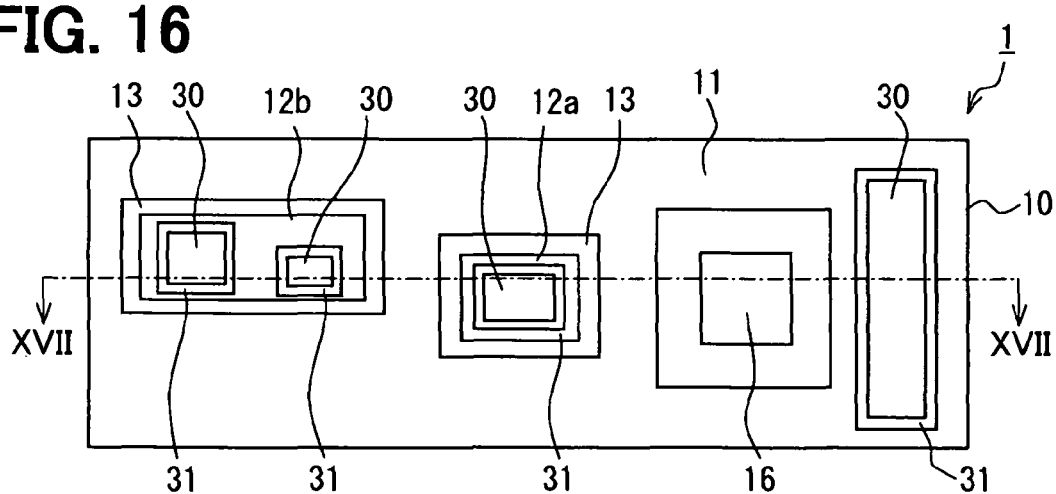
FIG. 16 is a plan view illustrating a semiconductor device according to a fourth embodiment of the invention.
Figure 17:
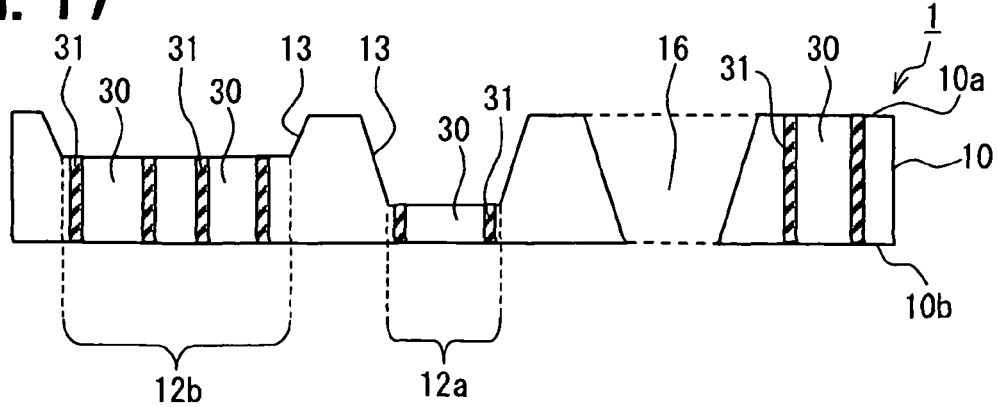
FIG. 17 is a cross-sectional view illustrating the semiconductor device taken along line XVII-XVII in FIG. 16.

In the manufacturing method illustrated in FIG. 3-FIG. 5, the first section 11 and the second section 12 having different thicknesses are provided in the semiconductor substrate 10 by etching. By etching, a hollow portion 16 penetrating the semiconductor substrate 10 from the upper surface 10a to the lower surface 10b may be provided while providing a plurality sections having different thicknesses. For example, as illustrated in FIG. 16 and FIG. 17, the semiconductor substrate 10 may have a first section 11, a thin second section 12a, a thick second section 12b, and the hollow portion 16. Even when the semiconductor substrate 10 has the hollow portion 16, the first section 11 ensures the mechanical strength of the semiconductor substrate 10. Thus, the semiconductor substrate 10 is restricted from cracking.

Figure 18:
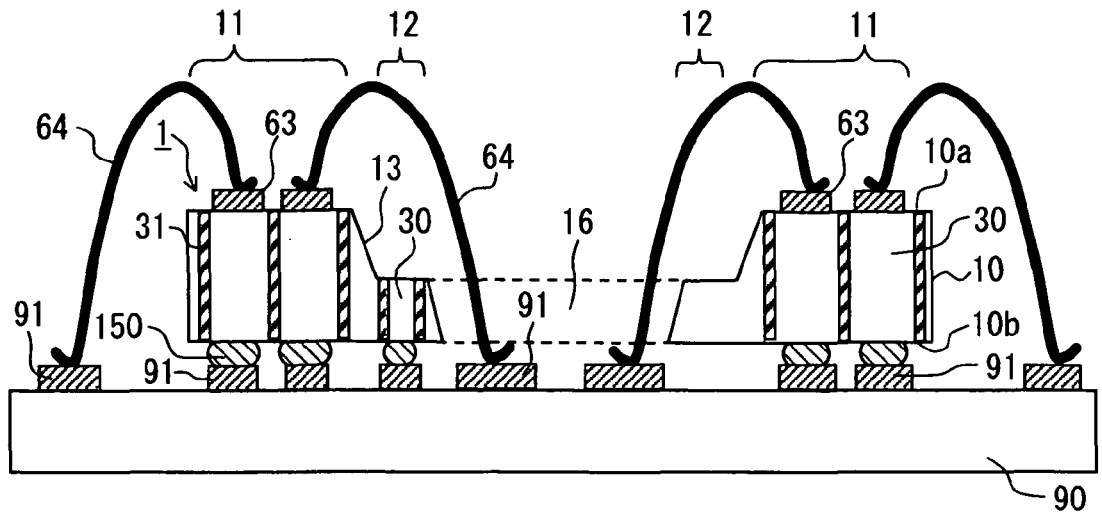
FIG. 18 is a cross-sectional view illustrating a state where a semiconductor device having hollow portions is mounted on a circuit board.

In a semiconductor device illustrated in FIG. 18, the upper surface 10a of the semiconductor substrate 10 is etched so that the semiconductor substrate 10 has the first section 11, the second section 12, and the hollow portion 16. The semiconductor substrate 10 is mounted on the circuit board 90 in such a manner that the lower surface 10b faces the upper surface of the circuit board 90. On the upper surface 10a of the semiconductor substrate 10, a plurality of electrodes 63 is disposed. A part of the electrodes 63 located on an outer peripheral side of the semiconductor substrate 10 is electrically coupled with the corresponding lands 91 of the circuit board 90 through corresponding wires 64. The other part of the electrodes 63 located adjacent to the hollow portion 16 is electrically coupled with the corresponding lands 91 of the circuit board 90 through the corresponding wires 64 that penetrate through the hollow portion 16. Electrodes (not shown) disposed on the lower surface 10b of the semiconductor substrate 10 are electrically coupled with the corresponding lands 91 of the circuit board 90 through the connecting member 150.

When the semiconductor substrate 10 has the hollow portion 16, the wires 64 can disposed to the side of the hollow portion 16 in addition to the outer peripheral side of the semiconductor substrate 10. Thus, even if the number of the electrodes 63 disposed on the upper surface 10a of the semiconductor substrate 10 increases, the electrodes 50 can be electrically coupled with the circuit board 90, effectively.

Figure 19:
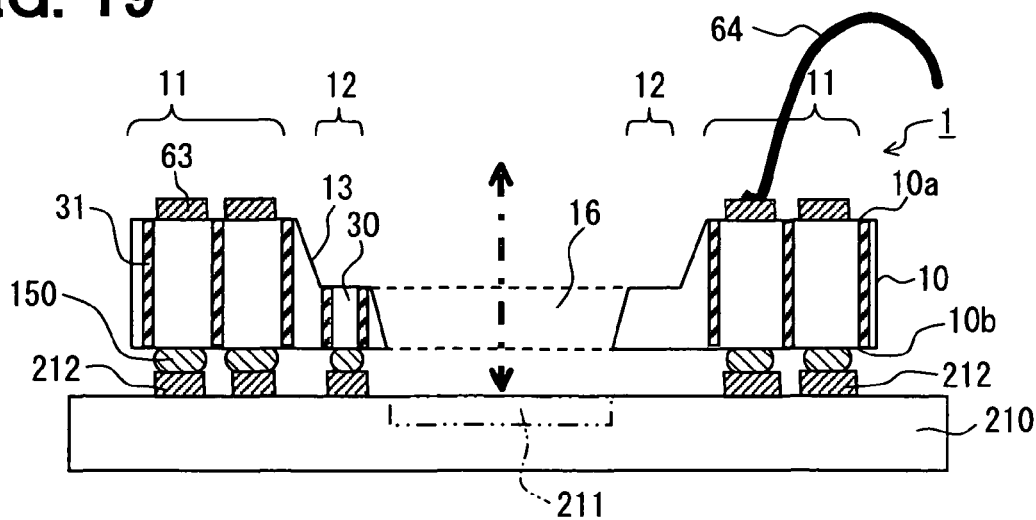
FIG. 19 is a cross-sectional view illustrating a state where a semiconductor device having hollow portions is mounted on a sensor chip.

In a semiconductor device 1 illustrated in FIG. 19, the semiconductor substrate 10 similar to the semiconductor substrate 10 illustrated in FIG. 18 is mounted on a sensor chip 210 in such a manner that the lower surface 10b faces the sensor chip 210. The semiconductor substrate 10 can function as a circuit board (i.e., processing circuit) of the sensor chip 210. In a direction approximately perpendicular to the thickness direction of the semiconductor substrate 10, a sensing part 211 of the sensor chip 210 illustrated by a dashed-two dotted line in FIG. 19 is located in the hollow portion 16 of the semiconductor substrate 10. Thus, the sensing part 211 is surrounded by the semiconductor substrate 10. The semiconductor substrate 10 is mounted on the sensor chip 210, for example, in such a manner that an open end of the hollow portion 16 on the lower-surface side is substantially aligned with an outer peripheral end of the sensing part 211 in the direction approximately perpendicular to the thickness direction of the semiconductor substrate 10.

In the present case, the sensing part 211 of the sensor chip 210 is capable of sensing through the hollow portion 16 of the semiconductor substrate 10. Thus, a sensing area of the sensing part 211 is limited by the semiconductor substrate 10. When the sensing part 211 includes a light detecting element that generates an electric signal in accordance with the strength of a detecting light, the semiconductor substrate 10 limits the light that enters the sensing part 211. Thereby, a reduction of a detecting accuracy and a variation in detecting results due to a diffuse light can be reduced. When the sensing part 211 includes a laser generating element that sends a laser light, an irradiation direction of the laser light can be limited by the semiconductor substrate 10 that configurates the processing circuit of the sensor chip 210.

Other Embodiment

Although the present invention has been fully described in connection with the exemplary embodiments thereof with reference to the accompanying drawings, it is to be noted that various changes and modifications will become apparent to those skilled in the art.

Each of the semiconductor devices 1 according to the first to fourth embodiments includes the semiconductor substrate 10 or 14 having the element-forming regions 30, the isolation trenches 31 penetrating the semiconductor substrate 10 so as to surround the respective element-forming-regions 30 for insulating the respective element-forming regions 30 from other element-forming regions 30, and the elements 50 formed in the respective element-forming regions 30. The semiconductor substrate 10 or 14 includes the sections having different thicknesses. The element-forming regions 30 are provided at least two of the sections including the thinnest section. The elements 50 include a double-sided electrode element and the double-sided electrode element is formed in the thinnest section.

The number of the elements 50 disposed in the first section 11 and the section 12, that is, the number of element-forming regions 30 insulated by the isolation trenches 31 are not limited to those of the above-described embodiments. In addition, the kinds of the elements 50 are not limited to those of the above-described embodiments. For example, in the above-described embodiments, the elements 50 include an n-channel MOS transistor and/or an n-channel IGBT. The elements 50 may also include a p-channel MOS and/or a p-channel IGBT. The elements 50 may have a trench gate structure.

Figure 10:
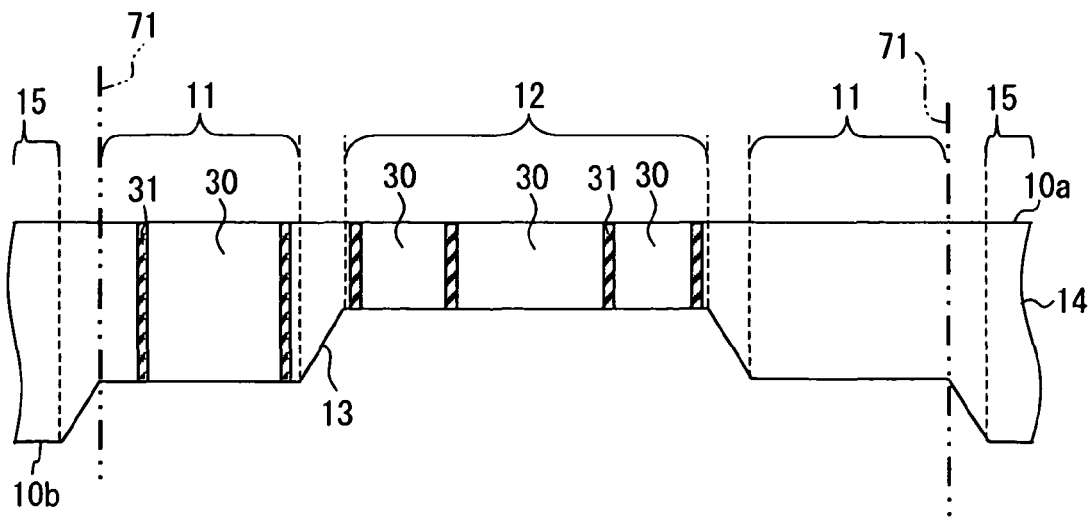
FIG. 10 is a cross-sectional view illustrating a semiconductor substrate according to a fourth modification of the first embodiment.

The wafer-shaped semiconductor substrate 14 illustrated in FIG. 10 includes the first section 11, the second section 12, and the third section 15 that is thicker than the first section 11 and the second section 12. The wafer-shaped semiconductor substrate 14 is diced along the dashed lines 71, and thereby the third section 15 and the connecting portion between the first section 11 and the third section 15 are removed and the semiconductor device 1 that has the semiconductor substrate 10 including the first section 11 and the second section 12 is formed. In this way, when the third section 15 thicker than the first section 11 is provided until the wafer-shaped semiconductor substrate 14 is diced into the chips, the mechanical strength of the wafer-shaped semiconductor substrate 14 until the dicing can be further improved.

Figure 20:
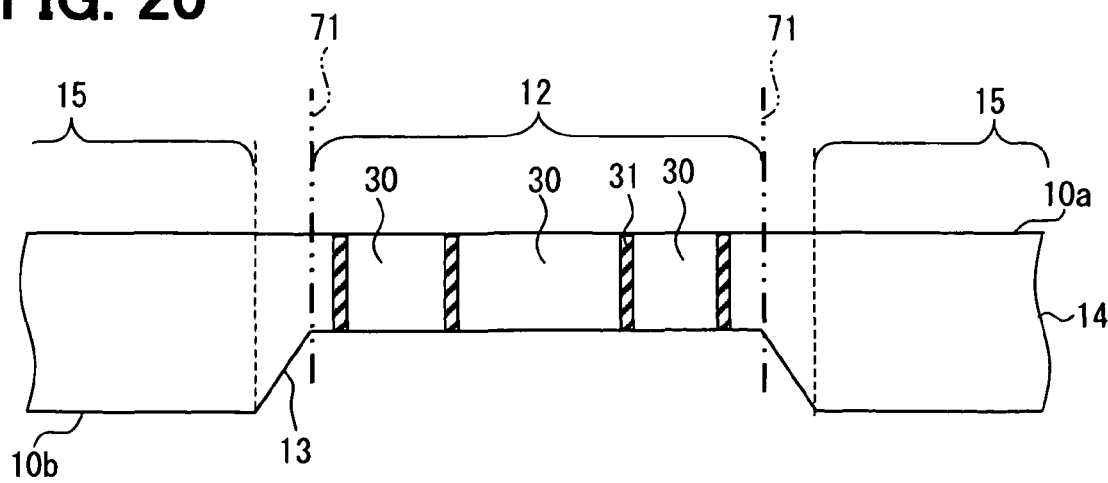
FIG. 20 is a cross-sectional view illustrating a semiconductor substrate according to another modification.

This technical idea may also be applied to a semiconductor substrate other than the semiconductor substrate 10 including a plurality of sections having different thicknesses and a plurality of elements disposed on at least two of the sections. For example, this technical idea may be applied when the semiconductor substrate 10 includes a plurality of sections having different thicknesses and the elements 50 are disposed at only one of the section. This technical idea may also be applied when the semiconductor substrate 10 has a uniform thickness. In an example illustrated in FIG. 20, a wafer-shaped semiconductor substrate 14 includes the second section 12 and the third section 15. The third section 15 is provided for ensuring the mechanical strength of the wafer-shaped semiconductor substrate 14. The thickness of the second section 12 is reduced by etching so that the second section 12 becomes thinner than the third section 15. Then, the wafer-shaped semiconductor substrate 14 is diced along dashed-two dotted lines 71 illustrated in FIG. 20. Thereby, the semiconductor substrate 10 that includes only the second section 12 having a plurality of element-forming regions 30 defined by a plurality of isolation trenches 31 is formed. In the present case, the semiconductor device 1 has the semiconductor substrate 10 having a uniform thickness, and a plurality of elements 50 including a double-sided electrode element is integrated in the semiconductor substrate 10. Because the wafer-shaped semiconductor substrate 14 has the third section 15 that is thicker than the second section 12 until the dicing, the mechanical strength of the wafer-shaped semiconductor substrate 14 can be improved. Therefore, the wafer-shaped semiconductor substrate 14 is restricted from cracking when the wafer-shaped semiconductor substrate 14 is carried or when the wafer-shaped semiconductor substrate 14 is diced. In addition, because the double-sided electrode element is formed in the second section 12, electric current easily flows between a pair of electrodes of the double-sided electrode element.

What is claimed is:

1. A semiconductor device comprising:
   a semiconductor substrate having a first surface and a second surface and including a plurality of sections having different thicknesses between the first surface and the second surface, the plurality of sections including a first section having a first thickness and a second section having a second thickness, the second section being a thinnest section in the plurality of sections, the first thickness being greater than the second thickness, and the semiconductor substrate further including a connecting portion extending between the first section and the second section, the connecting portion having first and second ends and a thickness extending from the first surface to the second surface, the first end of the connecting portion having the first thickness and being connected to the first section and the second end of the connecting portion having the second thickness and being connected to the second section, and the thickness of the connecting portion gradually tapering from the first thickness at the first end to the second thickness at the second end;
   a plurality of isolation trenches penetrating the semiconductor substrate from the first surface to the second surface for defining a plurality of element-forming regions therebetween, the plurality of isolation trenches including a first isolation trench penetrating the first section and a second isolation trench penetrating the second section, the connecting portion extending between the first isolation trench and the second isolation trench and being insulated and completely isolated from the first section and the second section by the isolation trenches penetrating the semiconductor substrate from the first surface to the second surface, a part of the plurality of element-forming regions provided in the first section and another part of the plurality of element-forming regions provided in the second section; and
   a plurality of elements located at respective ones of the plurality of element-forming regions, the plurality of elements including a first element located in the first section and a second element located in the second section, the first element and the second element having different breakdown voltages, the second element including a double-sided electrode element that includes a pair of electrodes separately disposed on the first surface and the second surface, and the plurality of elements including a vertical passive element that includes one of a diode, a resistor and a wiring element.

2. The semiconductor device according to claim 1, wherein the double-sided electrode element includes one of a vertical metal-oxide semiconductor transistor and an insulated gate bipolar transistor.

3. The semiconductor device according to claim 1, wherein:
   the plurality of elements includes another double-sided electrode element; and
   the another double-sided electrode element is located in the first section.

4. The semiconductor device according to claim 3, wherein:
   the plurality of sections further includes a third section having a third thickness;
   the third thickness is greater than the second thickness and is different from the first thickness;
   the plurality of elements includes a single-sided electrode element that includes a pair of electrodes disposed on the first surface; and
   the single-sided electrode element is located in the third section.

5. The semiconductor device according to claim 1, wherein:
   the double-sided electrode element is located only in the second section;
   the plurality of elements includes a single-sided electrode element that includes a pair of electrodes disposed on the first surface; and
   the single-sided electrode element is located in the first section.

6. The semiconductor device according to claim 4, wherein the single-sided electrode element includes one of a bipolar transistor, a lateral metal-oxide semiconductor transistor, and a complementary metal-oxide semiconductor.

7. The semiconductor device according to claim 3, wherein the pair of electrodes of the double-sided electrode element is electrically separated from the pair of electrodes of the another double-sided electrode element.

8. The semiconductor device according to claim 1, wherein each of the plurality of isolation trenches is selected from a trench filled with an insulating material, a trench filled with a conductive material through an oxide layer disposed on a sidewall of the trench, and a hollow trench.

9. The semiconductor device according to claim 1, wherein:
the plurality of elements includes a passive element, and
the passive element is located in the connecting portion.

10. The semiconductor device according to claim 1, wherein the semiconductor substrate has a wafer shape.

11. The semiconductor device according to claim 1, wherein the semiconductor substrate has a chip shape.

12. The semiconductor device according to claim 11, wherein the first section has a ring shape so as to surround the second section.

13. The semiconductor device according to claim 11, further comprising a mounted member, wherein:
the semiconductor substrate defines a recess portion on one of the first surface and the second surface at the second section with respect to the one of the first surface and the second surface at the first section; and
the mounted member is mounted on the one of the first surface and the second surface at the second section so as to be housed in the recess portion.

14. The semiconductor device according to claim 13, wherein the mounted member includes one of a semiconductor chip, a wiring substrate, and a heat sink.

15. The semiconductor device according to claim 11, wherein the semiconductor substrate further has a hollow portion extending from the first surface to the second surface.

16. The semiconductor device according to claim 15, further comprising:
a circuit board;
a plurality of lands disposed on a surface of the circuit board; and
a plurality of wiring, wherein:
the semiconductor substrate is disposed on the circuit board in such a manner that the second surface faces the surface of the circuit board;
the plurality of elements includes a plurality of electrodes disposed on the first surface of the semiconductor substrate;
a part of the plurality of electrodes is electrically coupled with corresponding ones of the plurality of lands by corresponding ones of the plurality of wiring on an outer peripheral side of the semiconductor substrate; and
the other part of the plurality of electrodes is electrically coupled with corresponding ones of the plurality of lands by corresponding ones of the plurality of wiring through the hollow portion.

17. The semiconductor device according to claim 15, further comprising a sensor chip having a sensing part, wherein
the semiconductor substrate is disposed on the sensor chip in such a manner that the sensing part is located in the hollow portion of the semiconductor substrate in a direction approximately perpendicular to a thickness direction of the semiconductor substrate and the sensing part is surrounded by the semiconductor substrate.

18. The semiconductor device according to claim 1, wherein the first element has a first breakdown voltage, the second element has a second breakdown voltage, and the first breakdown voltage is greater than the second breakdown voltage.

19. The semiconductor device according to claim 1, wherein the first thickness of the first section is constant and the second thickness of the second section is constant.

20. The semiconductor device according to claim 19, wherein the connecting portion is located between the first isolation trench and the second isolation trench and is insulated from the first section and the second section.

21. The semiconductor device according to claim 1, wherein the connecting portion is arranged between the first section and the second section and extends from the first surface of the first section to the second surface of the second section, and the first surface and the second surface are substantially parallel with each other in a thickness direction of the substrate.

22. The semiconductor device according to claim 1, wherein the first surface and the second surface are arranged on opposite sides of the semiconductor substrate.

23. A semiconductor device comprising:
a semiconductor substrate having a first surface and a second surface and including a plurality of sections having different thicknesses between the first surface and the second surface, the plurality of sections including a first section having a first thickness and a second section having a second thickness, the second section being a thinnest section in the plurality of sections, the first thickness being greater than the second thickness, and the semiconductor substrate further including a connecting portion extending between the first section and the second section, the connecting portion having first and second ends and a thickness extending from the first surface to the second surface, the first surface and the second surface being arranged on opposite sides of the connecting portion of the semiconductor substrate, the first end of the connecting portion having the first thickness and being connected to the first section and the second end of the connecting portion having the second thickness and being connected to the second section, and the thickness of the connecting portion gradually tapering from the first thickness at the first end to the second thickness at the second end;
a plurality of isolation trenches penetrating the semiconductor substrate from the first surface to the second surface for defining a plurality of element-forming regions therebetween, the connecting portion extending between a first isolation trench and a second isolation trench and being completely isolated from the first section and the second section by the isolation trenches penetrating the semiconductor substrate from the first surface to the second surface, a part of the plurality of element-forming regions provided in the first section and another part of the plurality of element-forming regions provided in the second section; and
a plurality of elements located at respective ones of the plurality of element-forming regions, the plurality of elements including a double-sided electrode element that includes a pair of electrodes separately disposed on the first surface and the second surface, the double-sided electrode element being located in the second section, and the plurality of elements including a vertical passive element that includes one of a diode, a resistor and a wiring element.

24. The semiconductor device according to claim 1, wherein the connecting portion has a thickness that changes from the first surface to the second surface.

25. A method of manufacturing a semiconductor device, comprising steps of:
preparing a semiconductor substrate having a first surface and a second surface and including a plurality of sections having different thicknesses between the first surface and the second surface, the plurality of sections including a first section having a first thickness and a second section having a second thickness, the second section being a thinnest section in the plurality of sections, the first thickness being greater than the second thickness, and
forming a connecting portion from the semiconductor substrate that extends between the first section and the second section, the connecting portion having first and second ends and a thickness extending from the first surface to the second surface, the first end of the connecting portion having the first thickness and being connected to the first section and the second end of the connecting portion having the second thickness and being connected to the second section, and the thickness of the connecting portion tapering from the first thickness at the first end to the second thickness at the second end;
forming a plurality of isolation trenches penetrating the semiconductor substrate from the first surface to the second surface for defining a plurality of element-forming regions therebetween, the plurality of isolation trenches including a first isolation trench penetrating the first section and a second isolation trench penetrating the second section, the connecting portion extending between the first isolation trench and the second isolation trench and being completely isolated from the first section and the second section by the isolation trenches penetrating the semiconductor substrate from the first surface to the second surface, a part of the plurality of element-forming regions provided in the first section and another part of the plurality of element-forming regions provided in the second section; and
forming a plurality of elements located at respective ones of the plurality of element-forming regions, the plurality of elements including a first element located in the first section and a second element located in the second section, the first element and the second element having different breakdown voltages, the second element including a double-sided electrode element that includes a pair of electrodes separately disposed on the first surface and the second surface, and the plurality of elements including a vertical passive element that includes one of a diode, a resistor and a wiring element.

26. The method according to claim 25, wherein:
the plurality of sections further includes a third section that is a thickest section in the plurality of sections;
the plurality of elements is formed at a part of the plurality of sections other than the third section; and
the semiconductor substrate is formed in such a manner that the third section and a connecting portion between the first section and the third section are removed.

* * * * *